United States Patent [19]

Carson et al.

[11] 4,077,015
[45] Feb. 28, 1978

[54] DUAL BANDWIDTH LOOP FILTER WITH SWEEP GENERATOR

[75] Inventors: Lansing McClain Carson, Scottsdale, Ariz.

[73] Assignee: Motorola, Inc., Schaumburg, Ill.

[21] Appl. No.: 646,784

[22] Filed: Jan. 6, 1976

[51] Int. Cl.² ............................................. H03B 3/04
[52] U.S. Cl. ........................................ 331/4; 331/17
[58] Field of Search ................... 325/419, 420; 331/4, 331/17

[56] References Cited

U.S. PATENT DOCUMENTS

| | | | |
|---|---|---|---|
| 2,932,793 | 4/1960 | Smith et al. | 331/17 |
| 3,158,820 | 11/1964 | Lamplot | 331/4 |
| 3,346,814 | 10/1967 | Haggai | 331/17 |
| 3,621,399 | 11/1971 | Rabow | 325/419 |
| 4,007,429 | 2/1977 | Cadalora | 331/17 |

Primary Examiner—John Kominski
Attorney, Agent, or Firm—Eugene A. Parsons

[57] ABSTRACT

A dual bandwidth loop filter includes a filter loop, resistive means, switching means for coupling and decoupling the resistive means for changing the bandwidth of the loop from a wider acquisition bandwidth to a narrower tracking bandwidth and a sweep generator for enabling the filter to provide sweep acquisition of an incoming signal.

3 Claims, 1 Drawing Figure

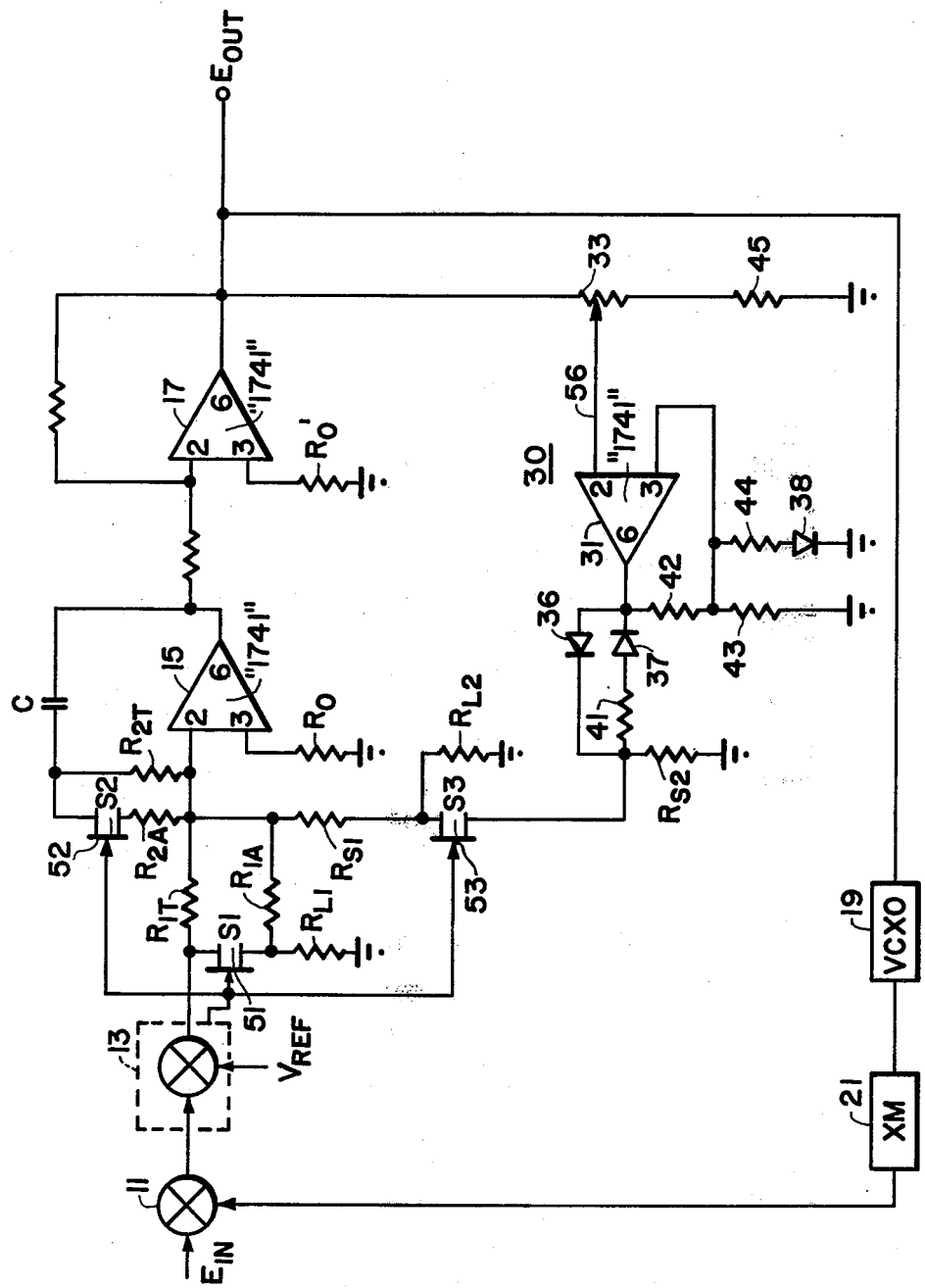

DUAL BANDWIDTH LOOP FILTER WITH SWEEP GENERATOR

FIELD OF THE INVENTION

This invention relates to an improved dual bandwidth filter and use of such a dual bandwidth filter with an automatic sweep acquisition means in a phase-locked loop configuration.

PRIOR ART

In many applications where signal acquisition and tracking is important, a phase-locked loop is generally utilized to acquire and track an incoming signal of a given frequency.

According to the prior art there have been many different approaches for acquiring and tracking the incoming signal. One such approach has been to use a narrow bandwidth phase-locked loop for acquiring and tracking the incoming signal. The reason for limiting the phase-locked loop bandwidth to a narrow band is to make the loop relatively insensitive to the noise signal where the noise signal may either be due to the thermal noise of the filter itself or the noise introduced into the signal during its transit. However, such a phase-locked loop is susceptible to miss the incoming signal in that the incoming signal may not fall within the narrow band to which the phase-locked loop is tuned.

Another type of phase-locked loop is the type where during the acquisition mode the operating bandwidth of the filter is maintained at a relatively wide acquisition bandwidth to increase the probability of detecting the incoming signal. Such a loop is usually provided with suitable capacitive switching means to switch the loop from a wide acquistion bandwidth to a narrow bandwidth for tracking signal once it is detected.

The phase-locked loop of the type that has dual bandwidth operating capability of the aforementioned type, however, has been found to be susceptible to a number of deficiencies. One such deficiency is due to the adverse effect of the transients introduced by the capacitive switch in the performance of the loop and another deficiency is due to the change in the amplification offset that affects the performance of the filter.

SUMMARY OF THE INVENTION

It is an object of the present invention to provide an improved dual bandwidth loop filter.

It is still another object of the present invention to provide an improved dual bandwidth loop filter that overcomes the aforementioned shortcomings of the prior art.

In accordance with the present invention the aforementioned and other objects are attained by an improved dual bandwidth loop filter with resistive means and switching means operatively disposed in the loop filter for switching the resistive means in and out of the loop and thereby switch the loop filter from the wider acquisition bandwidth to narrower tracking bandwidth and vice versa.

According to another feature of the loop filter, the loop filter may be also provided with a sweep generator for aiding the sweep acquisition.

The dual bandwidth loop filter of the present invention is found to be transient free during the switchover from a wider to a narrower bandwidth and vice versa and found to eliminate the amplification offset problem.

The foregoing and other objects and features of the present invention will be more fully apprehended from the detailed description of an illustrative embodiment of the present invention in conjunction with the accompanying drawing.

DESCRIPTION OF THE DRAWING

The single FIGURE is a block/schematic diagram of a receiver including a dual bandwidth loop filter and sweep acquisiton circuitry embodying the present invention.

DETAILED DESCRIPTION

In accordance with the present invention there is shown an embodiment of a receiver which includes the inventive dual bandwidth loop filter with sweep generator adapted to receive incoming signal which may be in the form of an S band signal. The receiver as shown includes in its forward path a mixer 11, detector 13, a unity gain inverting amplifier 15, and an inverting amplifier 17, all connected in series and designed to operate in a conventional manner. In the feedback path there is provided an oscillator 19 which may be of conventional voltage controlled crystal oscillator design that takes the output of the inverting amplifier 17 and applies it to a frequency multiplier 21. The output of the multiplier 21 is applied to the mixer 11 so that the mixer can derive an IF signal from the incoming S signal in a conventional manner.

According to the prior art typically a voltage sweep generator of a suitable design is used to provide the necessary sweep voltage to the loop during the acquisition mode of the operation. Usually the sweep generator enables an RC integrator made of the RC series network connected in shunt with the amplifier 15 to enable the integrating circuit to provide its integrating function. That is, a sweep generator of a suitable circuitry is provided to enable the capacitor C to charge and discharge in a sawtooth wave fashion.

In accordance with a prior art, the bandwidth of the loop is designed to be of dual bandwidths by utilizing an extra capacitor coupled in shunt with the RC integrating circuitry and this capacitor is switched out during the acquisition mode and switched in during the tracking mode. Switching of the capacitor in and out during the operation of the dual bandwidth loop typically causes adverse effect upon the operational characteristics of the dual bandwidth loop because of the transients caused by the sudden discharge of the stored energy in the capacitor being switched.

In accordance with an aspect of the present invention broadly stated there is provided suitable resistive means and switching means in the loop filter. The switching means are provided to switch the resistive means in and out of the loop filter to couple and decouple the resistive means from the loop filter. With the resistive means coupled to the loop, the loop bandwidth is held at a wider bandwidth. When the resistive means is decoupled from the loop filter, the loop filter bandwidth is rendered narrower.

The operation of the switching means that control the coupling and decoupling of the resistive means is advantageously placed under the control of the detecting circuitry 13 that detects the acquisition of the incoming signal. Once the incoming signal acquisition is made the detector provides the necessary signal to actuate and cause the switching means to open and thus decouple the resistive means from the loop filter.

Advantageously according to another aspect of the present invention, sweep signal generating means 30 is provided to apply the sweep forcing voltage to the loop filter. The generating means is designed to include a comparator and associated elements for taking a sample of the output, $E_{OUT}$, of the loop filter, and limit detecting the sample. Such a sweep signal generating means 30 may include a comparator 31, a potentiometer 33, resistive elements 41 through 45, diodes 36, 37 and 38, operatively coupled, as illustrated in the drawing, in such a way that they perform the function of a regenerative comparator. Thus when the output of the loop reaches a limit the comparator switches and produces an opposite polarity voltage and applies it into the RC integrator circuitry of the loop filter. The comparator causes the integrator to reverse its direction of integration and by making one polarity of its output much larger than the other, the sawtooth retrace time can be minimized to speed up the acquisition process.

In effect, the sweep generating means 30 makes use of the integrator characteristic of the loop filter by summing a dc voltage proportional to the desired sweep rate. The loop filter output will continue to ramp under the stimulus of this dc voltage until a limit is detected at the output of a conventional "1741" type unity gain inverting amplifier, used as the comparator 31. This limit detection is accomplished by the 1741 amplifier in a regenerative comparator mode. If the comparator 31 output is initially negative, the ramp will be positive at the loop filter output and negative at the inverted output. A sample of the comparator output is also used as the comparator reference and in this case, will be a negative value. When the ramp at pin 2 of the comparator reaches the reference value, the feedback voltage, causes comparator 31 to switch to its positive state. This produces a positive voltage into the integrator via diode 36; switch 53 and resistor $R_{s1}$ and causes the ramp to change direction. The diodes and the resistive attenuator in the output of the 1741 comparator output provide for different ramp rates to give a small retrace time. The sweep limit adjustment, potentiometer 33, sets the required peak-to-peak ramp voltage. The FET switch 53 disables the sweep forcing voltage when the lock is detected as follows.

There is provided switching means S3 interposed between the sweep generator 30 and the RC integrating circuitry, and the switching means is placed under the control of the detector 13. In this manner when the signal is detected, that is, when the incoming signal is acquired, the sweep forcing input to the loop filter is disabled by actuating the switching means S3 and opening the path from the ground provided by the sweep generator 30 via the resistor $R_{S2}$. In this manner the sweep generator is removed or decoupled from the loop filter.

Now referring to the details of an illustrative embodiment of the present invention shown in the drawing, there are provided the switching means S1 and S2 for coupling and decoupling resistive means into and out of the loop filter to render it to have dual bandwidths. For the switches, field effect transistors S1 and S2 may be effectively coupled in a conventional manner to operate as switches, as illustrated. The control gates thereof, numbered 51 and 52, respectively, are coupled to a suitable voltage signal source, such as the output of the detector 13 as illustrated. Resistors $R_{1A}$ and $R_{2A}$ are coupled in series with the switches S1 and S2 as illustrated. Resistor $R_{1A}$ is coupled in shunt with a resistor $R_{1T}$, which couples the detector 13 to the amplifier 15. Resistor $R_{2A}$ is coupled in shunt with resistor $R_{2T}$. There is also provided a resistor $R_{L1}$ coupling the drain electrode of switch S1 to the ground as illustrated. The third switch, in the form of a field effect transistor switch S3, is coupled to the resistors $R_{2A}$ and $R_{2T}$ through a suitable resistive coupling means $R_{S1}$ from one electrode thereof and the other electrode thereof is coupled through a resistor $R_{S2}$ to ground. A suitable resistor $R_{L2}$ is coupled to the resistor $R_{S1}$ in the manner shown to provide ground to the RC integrating circuit.

With the circuit as connected, RC integrating circuitry with three distinct time constant is provided. When the switches S1 and S2 are closed, one time constant is formed where $R_{1A}$ and $R_{1T}$ form a parallel resistive circuit and $R_{2A}$ and $R_{2T}$ form a parallel resistive circuit. When the switches S1 and S2 are open, another time constant is formed where $R_{2A}$ is decoupled from the loop and $R_{1A}$ is no longer in parallel with $R_{1T}$. S3 is also closed when S1 and S2 are closed. Thus, resistor $R_{S2}$ is connected in parallel with $R_{L2}$. But with S3 open, $R_{S2}$ is decoupled from the loop. The output of the regenerative comparator 31 changes from one voltage to another and changes the direction of the charge and discharge of the capacitor, C, of the RC integrator circuit. This takes place when there takes place a reversal of the output voltage of the comparator when its input from the output of the loop applied thereto via the potentiometer 33 increases above a certain level.

The detection circuitry 13 may be a conventional coherent amplitude detector adjusted to provide an output of one level of one voltage, for example, zero volts signifying the fact that the incoming signal is not yet locked or tracked and provide output of another level of voltage, for example, $-6$ volts, signifying the condition that the incoming signal is acquired or tracked. Such voltage outputs are applied to the gate electrodes 51, 52, and 53 of the switches S1, S2 and S3.

With zero amplitude, the resistors $R_{1A}$ and $R_{2A}$ are coupled and parameters are so chosen that the switches S1, S2 and S3 are closed. In other words, during the acquisition mode, the voltage applied to the gate electrodes thereof maitained at zero voltage level. With the switches S1 and S2 closed, the time constant of the RC integrating circuitry is determined essentially by the parallel combinations of the resistors $R_{2A}$ and $R_{2T}$ and $R_{1A}$ and $R_{1T}$. When lock is detected the switches S1, S2 and S3 are opened and the new loop bandwidth is determined effectively by the resistors $R_{2T}$ and $R_{1T}$. Effectively the sweep forcing voltage, of a suitable amplitude, can be generated by the sweep generating circuitry 30 and the sweep forcing voltage is applied to the dual bandwidth loop only when the switch S3 is closed, that is, only when the incoming signal is being acquired. This takes place therefore, while the dual bandwidth closed loop operates in its wider bandwidth mode.

Since only resistors are switched in and out, as illustrated above, there is no net change in the charge in the capacitor C before and after switching. Consequently no sudden change takes place in the output of the loop. The effect of the bias current on the amplifier offset that is contributed by the use of the amplifier 15 can be effectively negated in both the acquisition and tracking mode by selecting the resistance $R_0$ to be substantially equal to the parallel combination of $R_{1A} + R_{L1}$ in parallel with $R_{S1} + R_{L2}$. In this way the offset is cancelled and the state of switch S1 has little effect.

The parameters of the various circuit elements, such as the resistors and the capacitor, can be selected so that the enable the loop to function as a dual bandwidth loop, using the following mathematical relationship.

To optimize both acquisition and tracking characteristics it as established that the loop bandwidth should be switched from one bandwidth, for example, 600 Hz, during acquisition to another bandwidth, for example, 200 Hz, after lock was detected.

The circuit employs field effect transistors as switches S1, S2 and S3 to change the loop time constants by switching resistors and to disable the sweep forcing voltage. When in the acquisition mode, all switches are closed. Time constants $t_{1A}$ and $t_{2A}$ are determined by the parallel combinations $R_{2A} \| \| R_{2T}$ and $R_{1A} \| \| R_{1T}$ with capacitor C. When lock is detected the switches open up and the new loop bandwidth is determined by $R_{2T}$ and $R_{1T}$. Since the capacitor is not switched there is no net change in charge before and after switching and consequently no step in the loop filter output occurs.

The effect of bias current on the amplifier offset can be negated in both modes by selecting $$R_o = (R_{1A} + R_{L1}) \| (R_{S1} + R_{L2})$$

under the assumption that $R_{1T} >> R_{1A}$.

With the type and structure of the loop filter defined it remains to calculate the values for the required loop bandwidths and sweep rate. The circuit schematic shown in the drawing provides a simplified model of the receiver configuration. For the filter as shown, the three time constants of the loop are given by $$t_1 = R_1 C = \frac{9 K_D K_V M \alpha o}{32 \beta_{Lo}^2}$$

$$t_2 = R_2 C = \frac{3}{4 \beta_{Lo}}$$

$$t_s = R_{s1} C = \frac{V_i t}{V_s}$$

$K_D$ = Phase Detection Gain Constant in V/rad of the detector 13.
$K_V$ = VCXO deviation sensitivity Rad/V of the oscillator 19.
M = Frequency multiplication ratio
$\alpha o$ = Threshold loop gain suppression factor
Vi = Sweep Forcing Voltage
Vs = Sweep Voltage at Loop Filter Output
$\beta Lo$ = Threshold loop noise bandwidth The open loop gain constants which were implemented experimentally are tabulated below.
$K_D$ = 0.32 Volts/radian
$K_V$ = $2\pi \times$ 750 radians/volts
M = 110.5
$\alpha o$ = 0.4

Using these values the tracking loop bandwidth of 200 Hz requires the following time constants:

$t_{1T} = R_{1T} C$ = 468 ms $t_{2T} = R_{2T} C$ = 3.75 ms

The acquisition bandwidth of 600 Hz requires:

$$t_{1A} = \frac{R_{1T} R_{1A} C}{R_{1T} + R_{1A}} = 51 \text{ ms}$$

-continued $$t_{2A} = \frac{R_{2T} R_{2A} C}{R_{2T} + R_{2A}} = 1.25 \text{ ms}$$

For a $C = 1 \cdot \mu f$ the required resistors are
$R_{1T}$ = 470K
$R_{2T}$ = 3.9K
$R_{1A}$ = 56K
$R_{2A}$ = 1.8K To determine the sweep time constant, for an acquisition range of $\Delta f$ = 20KHz, the required ramp voltage, $V_s$, is determined by $$V_s = \frac{\Delta f}{K_v M} \frac{200 \text{ hHz}}{750 \text{ HZ/volt} \times 110.5} = 2.4 \text{ volts}$$

The sweep forcing voltage $V_i$ and the sweep summing resistor $R_{s1}$, can be chosen independently. For an $R_{s1}$ = 56K, $V_i$ is calculated to give a 4 second sweep.

$$V_i = \frac{Rs\, C\, Vs}{t} = 30 \text{ mV}.$$

Various changes and modifications may be made to the present invention from the teachings of the principles of the present invention and described above by persons of ordinary skill without departing from the spirit and scope thereof.

What is claimed is:

1. In a phase locked loop including a voltage controlled oscillator, a phase comparator and a lock detector providing an output signal indicating a locked condition of the loop, dual bandwidth loop filter means and sweep acquisition circuitry comprising:

a. an acitive filter including an amplifier with a first resistor and capacitor in a feedback loop therearound and a second resistor in an input circuit thereof;

b. a regenerative comparator including a dual input amplifier with a feedback circuit from an output thereof to one of the inputs for providing a comparator reference signal and the other of the inputs connected to receive output signals from said active filter, said comparator including circuitry associated with the output thereof for making signals of a first polarity appearing at the output substantially larger than signals of a second polarity appearing at the output;

c. first, second and third switches each having control inputs connected to receive the output signal from the lock detector and operate in response thereto;

d. resistor means connected in conjunction with said first switch to the first resistor in the feedback loop of said active filter for altering the resistance in the feedback loop upon operation of said first switch;

e. resistor means connected in conjuction with said second switch to the second resistor in the input circuit of said active filter for altering the resistance in the input circuit upon operation of said second switch; and f. said third switch coupling output signals from said comparator to said active filter upon operation of said third switch for providing a sweep forcing signal to said active filter, the sweep signal produced thereby having a substantially minimized retrace time.

2. Dual bandwidth loop filter means and sweep acquisition circuitry as claimed in claim 1 wherein the first, second and third switches are all field effect transistors.

3. Dual bandwidth loop filter means and sweep acquisition circuitry as claimed in claim 1 wherein the circuitry associated with the output of the regenerative comparator includes a first diode and resistor means connected in series with a second diode connected in parallel therewith and in reversed polarity, said circuitry being connected in series between the output of the amplifier in the regenerative comparator and the third switch.

* * * * *